(12) United States Patent
Lee et al.

(10) Patent No.: US 10,439,169 B2
(45) Date of Patent: Oct. 8, 2019

(54) ORGANIC LIGHT EMITTING DEVICE

(71) Applicant: SAMSUNG DISPLAY CO., LTD., Yongin-si, Gyeonggi-do (KR)

(72) Inventors: Jae Yong Lee, Yongin-si (KR); Ill Soo Park, Yongin-si (KR); Seul Ong Kim, Yongin-si (KR); Chi Yeoung Shim, Yongin-si (KR)

(73) Assignee: Samsung Display Co., Ltd., Yongin-Si, Gyeonggi-do (KR)

( * ) Notice: Subject to any disclaimer, the term of this patent is extended or adjusted under 35 U.S.C. 154(b) by 0 days.

(21) Appl. No.: 15/813,563

(22) Filed: Nov. 15, 2017

(65) Prior Publication Data

US 2018/0198097 A1     Jul. 12, 2018

(30) Foreign Application Priority Data

Jan. 6, 2017     (KR) .................. 10-2017-0002413

(51) Int. Cl.
*H01L 21/00*     (2006.01)
*H01L 51/56*     (2006.01)
(Continued)

(52) U.S. Cl.
CPC .......... *H01L 51/56* (2013.01); *H01L 27/3211* (2013.01); *H01L 51/001* (2013.01);
(Continued)

(58) Field of Classification Search
CPC ... H01L 51/56; H01L 27/3211; H01L 51/001; H01L 51/0011; H01L 51/5012;
(Continued)

(56) References Cited

U.S. PATENT DOCUMENTS 9,252,397 B2 *   2/2016   Harikrishna Mohan .................... H01L 51/0013
9,277,619 B2     3/2016   Hyuga
(Continued)

FOREIGN PATENT DOCUMENTS

JP     2004-228088 A     8/2004
JP     2011-199174 A     10/2011
(Continued)

*Primary Examiner* — Richard A Booth
(74) *Attorney, Agent, or Firm* — Lee & Morse, P.C.

(57) ABSTRACT

A method of forming a thin film includes preparing a mixture including a light emitting layer material that forms a light emitting layer and a material that forms a layer adjacent to the light emitting layer, and sequentially laminating the light emitting layer and the layer adjacent to the light emitting layer onto a substrate inside a chamber by heating the mixture to a process temperature of the light emitting layer material and a process temperature of the additional material. The light emitting layer material and the additional material have process temperatures that are different from each other. The light emitting layer material and the additional material are laminated onto the substrate sequentially from one of the light emitting layer material and the additional material having a lower process temperature to one of the light emitting layer material and the additional material having a higher process temperature.

7 Claims, 4 Drawing Sheets

(51) Int. Cl.
  *H01L 27/32*  (2006.01)
  *H01L 51/00*  (2006.01)
  *H01L 51/50*  (2006.01)

(52) U.S. Cl.
  CPC ...... *H01L 51/0011* (2013.01); *H01L 51/5012* (2013.01); *H01L 51/5072* (2013.01); *H01L 27/3244* (2013.01); *H01L 51/5056* (2013.01); *H01L 51/5088* (2013.01); *H01L 51/5092* (2013.01); *H01L 51/5096* (2013.01); *H01L 2227/323* (2013.01); *H01L 2251/556* (2013.01)

(58) Field of Classification Search
  CPC ............. H01L 51/5072; H01L 27/3244; H01L 51/5056; H01L 51/5088; H01L 51/5092
  See application file for complete search history.

(56) References Cited

U.S. PATENT DOCUMENTS

| | | |
|---|---|---|
| 2004/0142098 A1 | 7/2004 | Ghosh et al. |
| 2016/0099422 A1 | 4/2016 | Zeng et al. |

FOREIGN PATENT DOCUMENTS

| | | |
|---|---|---|
| JP | 2012-195140 A | 10/2012 |
| JP | 2016-76700 A | 5/2016 |
| KR | 10-2005-0076799 A | 7/2005 |

* cited by examiner

ORGANIC LIGHT EMITTING DEVICE

CROSS-REFERENCE TO RELATED APPLICATION

Korean Patent Application No. 10-2017-0002413, filed on Jan. 6, 2017, in the Korean Intellectual Property Office, and entitled: "Organic Light Emitting Device," is incorporated by reference herein in its entirety.

BACKGROUND

1. Field

Embodiments relate to an organic light emitting device material for manufacturing an organic light emitting device, and a method of manufacturing the organic light emitting device by using the organic light emitting device material.

2. Description of the Related Art

An organic light emitting device includes a pair of electrodes and an organic composite layer interposed between the electrodes. The organic light emitting device is an active light emitting device using a phenomenon that, when currents are supplied to the electrodes, electrons and holes injected through the electrodes recombine in the organic composite layer to generate light. This organic light emitting device is lightweight, has a few components, and can be constructed by a simple and straightforward manufacturing process. The organic light emitting device has a wide viewing angle and generates a high quality image. Also, the organic light emitting device may perfectly represent high color purity and moving images while driven by a low voltage source, which reduces power consumption. Therefore, its electrical characteristics are suitable for portable electron devices.

A general organic light emitting device includes a substrate/a cathode/an organic composite layer/and an anode. The organic composite layer may include at least one of a hole injection layer, a hole transport layer, an electron blocking layer, a light emitting layer, a hole blocking layer, an electron transport layer, and an electron injection layer.

In order to minimize power consumption of the organic light emitting device, recent studies have been concentrated on a tandem-type organic light emitting device, which has a plurality of light emitting units as well as interconnecting layers interposed between the light emitting units.

SUMMARY

Embodiments are directed to a method of forming a thin film including preparing a mixture for depositing a thin film, the mixture for depositing a thin film including a light emitting layer material that forms a light emitting layer and an additional material that forms at least one layer adjacent to the light emitting layer, and sequentially laminating the light emitting layer and the at least one layer adjacent to the light emitting layer onto a substrate inside a chamber by heating the mixture for depositing a thin film up to a process temperatures of the light emitting layer material and a process temperature of the additional material. The light emitting layer material and the additional material have process temperatures that are different from each other. The light emitting layer material and the additional material are laminated onto the substrate sequentially from one of the light emitting layer material and the additional material having a lower process temperature to one of the light emitting layer material and the additional material having a higher process temperature.

A temperature of the mixture for depositing a thin film may be increased in a stepwise manner.

The additional material may include a hole injection layer material and a hole transport layer material. The hole injection layer material and the hole transport layer material may be codeposited.

The mixture for depositing a thin film may include a first mixture for forming a first organic composite layer that emits light in a first wavelength band, a second mixture for forming a second organic composite layer that emits light in a second wavelength band, and a third mixture for forming a third organic composite layer that emits light in a third wavelength band. The method of forming a thin film may include forming the respective first organic composite layer, the second organic composite layer, and the third organic composite layer in different areas of the substrate.

The method may include heating the first mixture, the second mixture, and the third mixture in a single chamber.

The method of forming a thin film may further include attaching a first mask onto the substrate, forming a first organic composite layer on the substrate by heating the first mixture, removing the first mask and attaching a second mask onto the substrate, forming a second organic composite layer on the substrate by heating the second mixture, removing the second mask and attaching a third mask onto the substrate, and forming a third organic composite layer on the substrate by heating the third mixture.

Embodiments are also directed to a mixture for depositing a thin film including a light emitting layer material for forming a light emitting layer of an organic light emitting device and an additional material for forming at least one layer to be adjacent to the light emitting layer. The light emitting layer material and the additional material may have different process temperatures at which a vapor pressure within a chamber comes to equal a process pressure.

The additional material may include at least one selected from a hole injection layer material, a hole transport layer material, an electron transport layer material, and an electron injection layer material.

The additional material may further include at least one selected from an electron blocking layer material and a hole blocking layer material.

The additional material may include the electron transport layer material, the light emitting layer material, and the hole transport layer material.

The electron transport layer material may have a first process temperature, the light emitting layer material has a second process temperature, and the hole transport layer material may have a third process temperature. The first process temperature may differ from the second process temperature and the second process temperature may differ from the third process temperature by about 20-100° C.

The process pressure may be about $10^{-4}$-$10^{-9}$ Torr.

The hole injection layer material and the hole transport layer material may have process temperatures that enable codeposition of the hole injection layer material and the hole transport layer material while manufacturing an organic light emitting device.

The light emitting layer material may include a host material and a dopant material.

A process temperature of the host material and a process temperature of the dopant material may differ from each other by not more than about 10° C.

At least one of the light emitting layer material and the additional material may be selected based on a wavelength band of light emitted from the light emitting layer.

The mixture for depositing a thin film may further include a heat conductor that delivers heat to the light emitting layer material and the additional material and a binder that links the light emitting layer material with the additional material.

The mixture for depositing a thin film may have a tabular shape, a pellet shape, or a granular shape.

BRIEF DESCRIPTION OF THE DRAWINGS

Features will become apparent to those of skill in the art by describing in detail exemplary embodiments with reference to the attached drawings in which.

DETAILED DESCRIPTION

Figure 1:
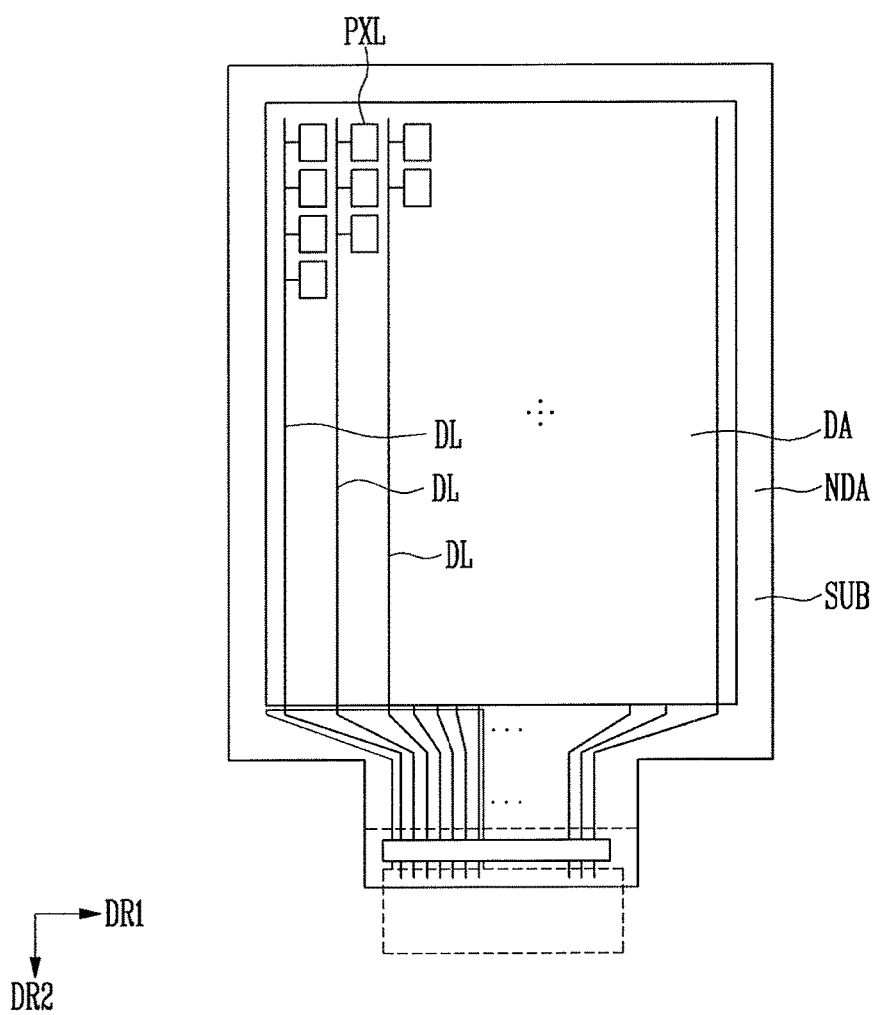
FIG. 1 illustrates a plan view of a display device according to one embodiment.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing figures, the dimensions of layers and regions may be exaggerated for clarity of illustration. It will also be understood that when a layer or element is referred to as being "on" another layer or substrate, it may be directly on the other layer or substrate, or intervening layers may also be present. Further, it will be understood that when a layer is referred to as being "under" another layer, it may be directly under, and one or more intervening layers may also be present. In addition, it will also be understood that when a layer is referred to as being "between" two layers, it may be the only layer between the two layers, or one or more intervening layers may also be present. Like reference numerals refer to like elements throughout.

FIG. 1 illustrates a plan view of a display device according to an embodiment.

Referring to FIG. 1, a display device according to an embodiment includes pixels PXL on a substrate SUB, and a line portion connected to the pixels PXL.

The substrate SUB includes a display area DA and a non-display area NDA, which is provided on at least one side of the display area DA.

The substrate SUB have a roughly quadrangular shape. For example, the substrate SUB may have a rectangular shape. In one embodiment, the substrate SUB have a pair of short sides, which are parallel with each other in a first direction DR1, and a pair of long sides, which are parallel with each other in a second direction DR2.

The substrate SUB may also be provided in various shapes such as a closed type polygon having straight sides, a circle, ellipse, etc. including sides made of curved lines, or semi-circle, semi-ellipse, etc. including sides made of straight and curved lines. In some implementations, when the substrate SUB includes sides that are straight lines, at least a portion of angled corners may be in a form of curved lines. For example, when the substrate SUB has a rectangular shape, a position where adjacent straight sides joins may be replaced with a curved line having a predetermined curvature. For example, a vertex point of the rectangular shape be in a form of a curved side having a predetermined curvature. Both adjacent ends of the curved side may be connected with two adjacent straight sides. The curvature may be set based on a position. For example, the curvature may be varied according to a position from which the curved line begins, a length of the curved line, etc.

The display area DA is an area where a plurality of pixels PXL are provided and an image is displayed. The display area DA have a shape corresponding to the shape of the substrate SUB. For example, the substrate SUB, the display area DA may be provided in various shapes such as a closed type polygon having straight sides, a circle, ellipse, etc. including sides made of curved lines, or semi-circle, semi-ellipse, etc. including sides made of straight and curved lines. In an embodiment, when the display area DA includes sides in a form of straight lines, at least a portion of angled corners may be in a form of curved lines.

The pixels PXL may be provided on the display area DA of the substrate SUB. Each pixel PXL is a minimum unit for displaying an image, and there may be plural pixels PXL. The pixels PXL emit white light and/or color light. Each pixel PXL emit one of red, green, and blue colors. In some implementations, each pixel emit colors such as cyan, magenta, yellow, etc.

Figure 2:
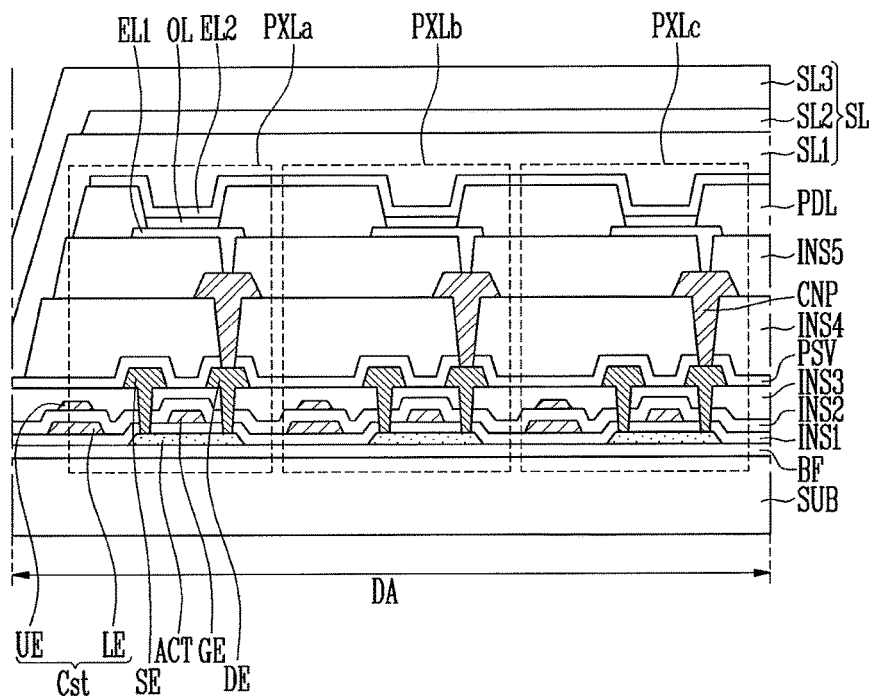
FIG. 2 illustrates a cross-sectional view of a display device according to an embodiment.

FIG. 2 illustrates a cross-sectional view of a display device according to an embodiment. A display area DA is shown in FIG. 2. In the following, respective layers of the display area DA are explained in more detail.

The pixels PXLa, PXLb, PXLc according to an embodiment may be on the substrate SUB.

The substrate SUB be made of an insulating material such as a glass, resin, etc. In some implementations, the substrate SUB be made of a material with flexibility such that the substrate SUB may be bended or folded. The substrate SUB may have a single layer structure or a multi-layer structure.

The substrate SUB may be made of various materials. For example, the substrate may be made of an FRP (Fiber reinforced plastic), etc. In some implementations, the substrate SUB include, for example, at least one of polystyrene, polyvinyl alcohol, polymethyl methacrylate, polyethersulfone, polyacrylate, polyetherimide, polyethylene naphthalate, polyethylene terephthalate, polyphenylene sulfide, polyarylate, polyimide, polycarbonate, triacetate cellulose, cellulose acetate propionate, and polyurethane.

A buffer layer BF may be formed on the substrate SUB. The buffer layer BF may help to prevent dopants from diffusing into switching and driving transistors. The buffer layer BF may be provided as a single layer or as a multi-layer structure including at least two layers.

The buffer layer BF may be an inorganic insulating film made of inorganic materials. For example, the buffer layer BF may be formed of silicon nitride, silicon oxide, silicon oxynitride, etc. When the buffer layer BF is provided as a multi-layer structure, respective layers may be formed of the same material or of different materials. The buffer layer BF may be omitted depending on materials and process conditions.

An active pattern ACT may be provided on the buffer layer BF. The active pattern ACT may be formed of a semiconductor material. Each of the active patterns ACT may include a source area, a drain area, and a channel area, which is provided between the source area and the drain area. The active pattern ACT may be a semiconductor pattern made of a polysilicon, an amorphous silicon, an oxide semiconductor, etc. The channel area is a semiconductor pattern which is not doped with dopants, and it may be an intrinsic semiconductor. The source area and the drain area may be semiconductor patterns that are doped with dopants. Dopants such as n-type dopants, p-type dopants, and other metals may be used as dopants.

A first insulation film INS1 is provided on the active pattern ACT. The first insulation film INS1 may be an inorganic insulating film made of an inorganic material. The insulation film INS1 may also be an organic insulating film made of an organic material. An inorganic insulation material such as polysiloxane, silicon nitride, silicon oxide, silicon oxynitride, etc. may be used as the inorganic material. The organic material may be a polyacrylic compound, a polyimide compound, a fluorinated carbon compound such as Teflon, or an organic insulation material such as benzocyclobutene compound.

A gate electrode GE and a capacitor lower electrode LE may be provided on the first insulation film INS1. The gate electrode GE may be formed to cover an area that corresponds to the channel area of the active pattern ACT.

The gate electrode GE and the capacitor lower electrode LE may be made of a metal. For example, the gate electrode GE may be made of at least one of gold (Au), silver (Ag), aluminum (Al), molybdenum (Mo), chromium (Cr), titanium (Ti), nickel (Ni), neodymium (Nd), and copper (Cu) or an alloy of these metals. The gate electrode GE may be provided as a single film, or as multiple films in which at least two materials of metals and alloys are laminated.

In one embodiment lines may be made of the same material and provided on the same layer as the gate electrode GE and the capacitor lower electrode LE. Here, the lines, including the gate lines, may be connected either in a direct or an indirect manner, with a portion of transistors within the respective pixels PXLa, PXLb, PXLc.

A second insulation film INS2 may be provided on the gate electrode GE and the capacitor lower electrode LE. The second insulation film INS2 may be an inorganic insulating film made of an inorganic material. Polysiloxane, silicon nitride, silicon oxide, silicon oxynitride, etc. may be used as the inorganic material.

A capacitor upper electrode UE may be provided on the second insulation film INS2. The capacitor upper electrode UE may be made of a metal. For example, the capacitor upper electrode UE may be made of at least one of gold (Au), silver (Ag), aluminum (Al), molybdenum (Mo), chromium (Cr), titanium (Ti), nickel (Ni), neodymium (Nd), and copper (Cu) or an alloy of these metals. The capacitor upper electrode UE may be provided as a single film or as multiple films in which at least two materials of metals and alloys are laminated.

The capacitor lower electrode LE and the capacitor upper electrode UE constitute a capacitor Cst with the second insulation film INS2 therebetween. The capacitor Cst may be embodied in various manners. For example, The capacitor Cst may include the capacitor lower electrode LE and the capacitor upper electrode UE as shown in FIG. 2.

A third insulation film INS3 may be provided on the capacitor upper electrode UE. The third insulation film INS3 may be an inorganic insulating film made of an inorganic material. Polysiloxane, silicon nitride, silicon oxide, silicon oxynitride, etc. may be used as the inorganic material.

A source electrode SE and a drain electrode DE may be provided on the third insulation film INS3. The source electrode SE and the drain electrode DE may contact a source area and a drain area of the active pattern ACT, respectively, through contact holes that are formed in the third insulation film INS3, second insulation film INS2 and the first insulation film INS1.

The source electrode SE and the drain electrode DE may be made of metals. For example, the source electrode SE and the drain electrode DE may be made of at least one of gold (Au), silver (Ag), aluminum (Al), molybdenum (Mo), chromium (Cr), titanium (Ti), nickel (Ni), neodymium (Nd), and copper (Cu) or an alloy of these metals. The source electrode SE and the drain electrode DE may be provided as a single film or as multiple films in which at least two materials of metals and alloys are laminated.

In one embodiment data lines DL or first power source lines may be made of the same material and provided on the same layer as the source electrode SE and the drain electrode DE. Here, the data lines DL or the first power source lines may be connected either in a direct or an indirect manner, with a portion of transistors within the respective pixels PXL, in particular, with the source electrode SE and the drain electrode DE.

A passivation layer PSV may be provided on the source electrode SE and the drain electrode DE. The passivation layer PSV may be an inorganic insulating film made of inorganic materials. Polysiloxane, silicon nitride, silicon oxide, silicon oxynitride, etc. be used as the inorganic material. The passivation layer PSV may be omitted in some embodiments.

A fourth insulation film INS4 may be provided on the passivation layer PSV. When the passivation layer PSV is omitted the fourth insulation film INS4 may be provided on the third insulation film INS3.

The fourth insulation film INS4 may be an organic insulating film made of an organic material. A polyacrylic compound, a polyimide compound, a fluorinated carbon compound such as Teflon, or an organic insulation material such as benzocyclobutene compound may be used as the organic material.

A connecting pattern CNP may be provided on the fourth insulation film INS4. The connecting pattern CNP may be connected with the drain electrode DE of the transistor through a contact hole that penetrates the fourth insulation film INS4 and the passivation layer PSV. The connecting pattern CNP may be made of at least one of gold (Au), silver (Ag), aluminum (Al), molybdenum (Mo), chromium (Cr), titanium (Ti), nickel (Ni), neodymium (Nd), and copper (Cu) or an alloy of these metals. The connecting pattern CNP be provided as a single film or as multiple films in which at least two materials of metals and alloys are laminated.

In one embodiment, other lines such as dummy power source lines, etc. may be made of the same material and provided on the same layer as the connecting pattern CNP.

A fifth insulation film INS5 may be provided on the connecting pattern CNP. The fifth insulation film INS5 may be an organic insulating film made of an organic material. A polyacrylic compound, a polyimide compound, a fluorinated carbon compound such as Teflon, or an organic insulation material such as benzocyclobutene compound may be used as the organic material.

A first electrode EL1 may be provided on the fifth insulation film INS5. The first electrode EL1 may be connected with the connecting pattern CNP through a contact hole that penetrates the fifth insulation film INS5, and may be connected with the transistor by being connected with the drain electrode DE through a contact hole that penetrates the fourth insulation film INS4 and passivation layer PSV. The first electrode EL1 may be an anode or a cathode.

In some implementations, an organic insulation film made of the fourth insulation film INS4 and the fifth insulation film INS5 may be provided on the passivation layer PSV. In some implementations, only one organic insulating film may be provided between the passivation layer PSV and the first electrode EL1. For example, only one organic insulating film may be provided on the passivation layer PSV, and the first electrode EL1 may be provided on the insulation film. In this case, the connecting pattern CNP may be omitted, and the first electrode EL1 may be connected with the drain electrode DE directly through the contact hole which is formed on the organic insulation film. Embodiments may encompass both the case where the insulating films are separated into the fourth insulation film INS4 and the fifth insulation film INS5 and the case where only one unseparated organic insulation film is used.

The first electrode EL1 may include at least one selected from indium tin oxide, which has superb conductivity, indium zinc oxide, tin oxide ($SnO_2$), zinc oxide (ZnO), an alkaline metal such as Li, Na, K, Rb, Cs and Fr, an alkaline earth metal such as Be, Mg, Ca, Sr, Ba and Ra; and a lanthanide group metal such as lanthanum (La), cerium (Ce), praseodymium (Pr), neodymium (Nd), promethium (Pm), samarium (Sm), europium (Eu), gadolinium (Gd), terbium (Tb), dysprosium (Dy), holmium (Ho), erbium (Er), thulium (Tm), ytterbium (Yb) and lutetium (Lu), etc.

In an embodiment, the first electrode EL1 may be made of one kind of metal. In some implementations, the first electrode EL1 may be made of at least two kinds of metal, for example, an alloy of Ag and Mg.

When an image is to be provided downwardly from the substrate SUB, the first electrode EL1 may be formed as a transparent conductive film. The first electrode EL1 may be made of a metal reflective film and/or a transparent conductive film when the image is to be provided upwardly from the substrate SUB.

A pixel defining film PDL for partitioning areas of pixels PXLa, PXLb, PXLc corresponding to the respective pixels PXLa, PXLb, PXLc may be formed on the substrate SUB on which the first electrode EL1, etc. is formed. The pixel defining film PDL may be an organic insulating film that is made of an organic material. A polyacrylic compound, a polyimide compound, a fluorinated carbon compound such as Teflon, or an organic insulation material such as benzocyclobutene compound may be used as the organic material.

The pixel defining film PDL may expose an upper surface of the first electrode EL1 and may protrude from the substrate SUB along boundaries of the pixels PXLa, PXLb, PXLc.

An organic composite layer OL may be provided on a pixel PXL area that is surrounded by the pixel defining film PDL. The organic composite layer OL may emit light of a specific wavelength depending on voltages which are applied on the first electrode EL1 and the second electrode EL2. The organic composite layer OL may include a light emitting layer and at least one layer that is adjacent to the light emitting layer. More details on the organic composite layer OL will be dealt with in the following.

The second electrode EL2 may be provided on the organic composite layer OL. The second electrode EL2 may be provided on every pixel PXL. In some implementations, the second electrode EL2 may be provided to cover most of the display area DA and may be shared by a plurality of pixels PXLa, PXLb, PXLc.

The second electrode EL2 may be used as one of an anode and a cathode depending on embodiments. The second electrode EL2 may serve as a cathode when the first electrode EL1 serves as an anode, or the second electrode EL2 may serve as an anode when the first electrode EL1 serves as a cathode.

The second electrode EL2 may include at least one selected from indium tin oxide with superb conductivity, indium zinc oxide, tin oxide ($SnO_2$), zinc oxide (ZnO), an alkaline metal such as Li, Na, K, Rb, Cs and Fr, an alkaline earth metal such as Be, Mg, Ca, Sr, Ba and Ra; and a lanthanide group metal such as lanthanum La, cerium (Ce), praseodymium (Pr), neodymium (Nd), promethium (Pm), samarium (Sm), europium (Eu), gadolinium (Gd), terbium (Tb), dysprosium (Dy), holmium (Ho), erbium (Er), thulium (Tm), ytterbium (Yb) and lutetium (Lu), etc. In an embodiment, the second electrode EL2 may be formed in a multi-film structure at least including a dual film having a metal thin film. For example, the second electrode EL2 may be formed as a triple film structure including ITO/Ag/ITO.

When an image is to be provided downwardly from the substrate SUB, the second electrode EL2 may be formed as a metal reflective film and/or a transparent conductive film. The second electrode EL2 may be a transparent conductive film when the image is to be provided upwardly from the substrate SUB.

A sealing film SL may be provided on the second electrode EL2. The sealing film SL may be formed as a single layer structure. In some implementations, the sealing film SL may be formed as a multi-layer structure. In an embodiment, the sealing film SL may include a first sealing film SL1, a second sealing film SL2, and a third sealing film SL3. The first sealing film SL1 to the third sealing film SL3 may be made of an organic material and/or an inorganic material. The outermost third sealing film SL3 may be made of an inorganic material.

In an embodiment, the first sealing film SL1 may be made of an inorganic material, the second sealing film SL2 may be made of an organic material or an inorganic material, and the third sealing film SL3 may be made of an inorganic material. Less moisture or oxygen may penetrate through an inorganic material than through an organic material. However, an inorganic material has less elasticity and flexibility, and may be vulnerable to cracks. The propagation of cracks may be prevented by forming the first sealing film SL1 and the third sealing film SL3 using an inorganic material and forming the second sealing film SL2 using an organic material. When the second sealing film SL2 is made of an organic material, an end portion of the second sealing film may be completely covered by third sealing film SL3 such that the end portion is not exposed to outside.

In an embodiment, a polyacrylic compound, a polyimide compound, a fluorinated carbon compound such as Teflon, and an organic insulation material such as benzocyclobutene compound may be used as the organic material. Polysiloxane, silicon nitride, silicon oxide, silicon oxynitride, etc., may be used as the inorganic material. When the second sealing film SL2 is made of an inorganic material instead of an organic material, various silicon-based insulation materials such as, e.g. hexamethyldisiloxane (HMDSO), octamethylcyclotetrasiloxane (OMCTSO), tetramethyldisiloxane (TMDSO), tetraethylorthosilicate (TEOS), etc., may be used. A material making up an organic composite layer OL forming a light emitting device may be damaged easily by moisture or oxygen, etc. from the outside. The sealing film SL protects the organic composite layer OL by covering the organic composite layer OL. The sealing film SL may cover the display area DA and may be extended to outside the display area DA.

When the sealing layer SL is made of an organic material, flexibility and elasticity, etc. may be improved. However, moisture or oxygen may penetrate into the insulation film made of organic material more easily than into inorganic insulation films. In one embodiment, in order to prevent penetration of moisture or oxygen through the insulation film made of an organic material, end portions of the insulation films, which are made of the organic material, may be covered by insulation films made of an inorganic material such that the end portions are not exposed to outside.

According to FIG. 2, a first pixel PXLa, a second pixel PXLb, and a third pixel PXLc may be provided on the display area. Each pixel PXLa, PXLb, PXLc may emit light at a different wavelength band. For example, light in a wavelength band of red light may be emitted from the first pixel PXLa, light in a wavelength band of green light may be emitted from the second pixel PXLb, and light in a wavelength band of blue light may be emitted from the third pixel PXLc. In some implementations, the respective pixels PXLa, PXLb, PXLc may emit light in the same wavelength band according to the arrangement of the pixels PXLa, PXLb, PXLc. For example, in an organic light emitting display device having a pantile matrix structure, respective pixels PXLa, PXLb, PXLc arranged in the same pixel column may all emit light in the same wavelength bands. In other cases, some pixels of the respective pixels PXLa, PXLb, PXLc may emit light in the same wavelength band while the remaining pixel may emit light in different wavelength bands.

On a plane, the first pixel PXLa, the second pixel PXLb, and the third pixel PXLc may be provided on different areas. The areas where the respective pixels PXLa, PXLb, PXLc are provided may not overlap with each other. Also, a black matrix may be provided between the respective pixels PXLa, PXLb, PXLc in order to prevent a color combination of light emitted from the pixels PXLa, PXLb, PXLc.

Figure 3:
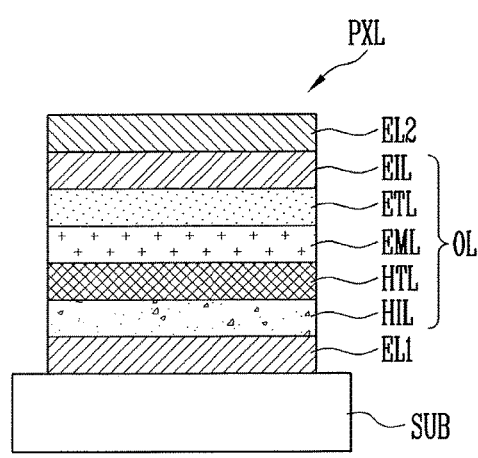
FIG. 3 illustrates a cross-sectional view of layers included in a pixel according to an embodiment.

FIG. 3 illustrates a cross-sectional view of layers included in a pixel PXL according to an embodiment.

In FIG. 3, the pixel PXL includes a substrate SUB, a first electrode EL1 provided on the substrate SUB, an organic composite layer OL provided on the first electrode EL1, and a second electrode EL2 provided on the organic composite layer OL. Details regarding the first electrode EL1, the second electrode EL2, and the substrate SUB may be the same as those mentioned in the above.

The organic composite layer OL may include a plurality of sub layers. The organic composite layer OL may include at least one of a light emitting layer EML, a hole injection layer HIL, a hole transport layer HTL, an electron transport layer ETL, and an electron injection layer EIL. Also, an electron blocking layer EBL and a hole blocking layer HBL may also be included in the organic composite layer OL. The hole blocking layer HBL may be provided between the light emitting layer EML and the electron transport layer ETL. The electron blocking layer EBL may be provided between the light emitting layer EML and the hole transport layer HTL. In some implementations, the organic composite layer OL may include a hole injection layer HIL, a hole transport layer HTL, an electron blocking layer EBL, a light emitting layer EML, a hole blocking layer HBL, an electron transport layer ETL, and an electron injection layer EIL that are sequentially laminated.

In some implementations, the hole injection layer HIL, the hole transport layer HTL, the hole blocking layer HBL, the electron transport layer ETL, the electron injection layer EIL, and the electron blocking layer EBL may have function other than or in addition to those described by their names. For example, in addition to a hole transporting function, the hole transport layer HTL may also perform the function of an electron blocking layer EBL to prevent electrons generated in the light emitting layer EML from diffusing according to the kind of a selected compound. In the similar manner, in addition to an electron transporting function, the electron transport layer ETL may also perform the function of a hole blocking layer HBL to prevent holes generated in the light emitting layer EML from diffusing according to the kind of a selected compound. In the following, respective sub layers of the organic composite layer OL will be explained in detail.

The hole injection layer HIL and the hole transport layer HTL are layers that receive holes from an anode or an anode side, respectively, and transport the holes to a cathode side. The hole injection layer HIL and hole transport layer HTL may have a single layer structure or multi-layer structure that consists of multiples layers of the same composition or heterogeneous compositions. A low molecular compound or a high molecular compound may be used as hole injection layer material and a hole transport layer material that are used for forming the hole injection layer HIL and hole transport layer HTL, respectively.

Examples that may be used as the hole injection layer material and the hole transport layer material for forming the hole injection layer and hole transport layer may include one or a mixture of at least two selected from a pyrrole derivative, a carbazole derivative, a triazole derivative, an oxazole derivative, an oxadiazole derivative, an imidazole derivative, a polyaryl alkane derivative, a pyrazoline derivative, a pyrazolone derivative, a phenylenediamine derivative, an arylamine derivative, an amino substitution chalcone derivative, a styryl derivative, an anthracene derivative, a fluorenone derivative, a hydrazone derivative, a stilbene derivative, a silazane derivative, an aromatic group direction third group amine compound, a styryl amine compound, an aromatic dimethylidyne compound, a phthalocyanine group compound, porphyrin group compound, a thiophene derivative, an organic silane derivative, a carbon, etc. The hole injection layer material and the hole transport layer material may be selected by considering process temperatures at which vapor pressures of the hole injection layer material and the hole transport layer material within a chamber come to be equal to process pressures.

An electron soluble dopant may be included in the hole injection layer HIL and the hole transport layer HTL. An inorganic compound or an organic compound may be used as the electron soluble dopant. Examples of the inorganic compound may include a metal halide, such as ferric chloride, aluminum chloride, gallium chloride, indium chloride, antimony pentachloride, etc., or a metal oxide such as vanadium pentachloride, molybdenum trioxide, etc. Examples of the organic compound may include a compound having a nitro group, a halogen, a cyano group, a trifluoromethyl group, etc. as a substituent; a quinone group compound, an acid anhydride group compound, fullerene, etc. These may be used alone or as a mixture of at least two kinds.

The hole blocking layer HBL may serve to prevent holes that have been transported from the anode side to the light emitting layer EML from going to the cathode side. The electron blocking layer EBL may serve to prevent electrons that have been transported from the cathode side to the light emitting layer EML from going to the anode side. Examples of the hole blocking layer material and the electron blocking layer material may include an aluminum complex such as BAlq, etc., a triazole derivative, and an a phenanthroline derivative such as a BCP, etc. The hole blocking layer material and the electron blocking layer material may be selected by considering process temperatures at which vapor pressures of the hole blocking layer material and the electron blocking layer material within a chamber come to be equal to process pressures.

The electron injection layer EIL and the electron transport layer ETL are layers that receive electrons from the cathode or the cathode side and transport the electrons to the anode side. Examples of the electron injection layer material and the electron transport layer material may include a heterocyclic tetracarboxyl acid anhydride, a pyridine, a pyrimidine, a triazine, an imidazole, a pyrazole, a triazole, an oxazole, an oxadiazole, a fluorenone, an anthraquinodimethane, an anthrone, a diphenyl quinone, a thiopyran dioxide, a carbodiimide, a fluorenylidene methane, a distyryl pyrazine, a fluorine substituted aromatic compound, naphthalene perylene, etc., a phthalocyanine or its derivative (can also include a condensed ring with other rings), and various metal complex such as a metal complex of an 8-quinolinol derivative, and a metal complex having a metal phthalocyanine, a benzoxazole, and a benzothiazole as a ligand. Metal ions in the metal complex may include a beryllium ion, a magnesium ion, an aluminum ion, a gallium ion, a zinc ion, an indium ion, a tin ion, a platinum ion, a palladium ion, etc. The ligand in the metal complex may be a heterocyclic ligand containing nitrogen with 1-30 carbons. As described in the following, the electron injection layer material and the electron transport layer material may be selected by considering process temperatures at which vapor pressures of the electron injection layer material and the electron transport layer material within a chamber come to be equal to process pressures.

When voltages are applied on the first electrode EL1 and the second electrode EL2, the light emitting layer EML may emit light of a specific wavelength band.

The light emitting layer material forming the light emitting layer EML may include a host material and a dopant material. CBP (4,4'-N,N'-dicarbazole-biphenyl), PVK (poly (n-vinylcarbazone)), ADN (9,10-di(naphthalene-2-yl)anthracene), TCTA, TPBI (1,3,5-tris(N-phenylbenzimidazole-2-yl)benzene)) or a combination thereof may be used as the host material. The host material may be selected by considering a process temperature at which a vapor pressure of the light emitting layer material within the chamber comes to be equal to the process pressure.

The dopant material included in the light emitting layer material may be Ir(pq)2(acac), PtOEP, Ir(piq)3, Btp2 Ir(acac), Ir(ppy)3, Ir(ppy)2(acac), Ir(mpyp)3, Flrpic, (F2ppy)2 Ir(tmd), or Ir(dfppz)3. mCP (N,N-dicarbazolyl-3,5-benzene), mCBP (3,3'-di(9H-carbazol-9-yl)-1,1'-biphenyl), CBP (4,4'-bis(carbazol-9-yl)biphenyl), TPBI (1,3,5-tris(N-phenylbenzimidazole-2-yl)benzene)), BmPyPb (1,3,5-tri [(3-pyridyl)-phen-3-yl]benzene), TSPO1 (diphenylphosphine oxide-4-triphenylsilyl phenyl), Alq3 (tris(8-quinolinolate)aluminum, a a 2,5-diaryl silole derivative (PyPySPyPy), perfluorinated compound (PF-6 P), a COT (Octasubstituted cyclooctatetraene), TAZ, Bphen (4,7-diphenyl-1,10-phenanthroline)), BCP, Balq or a combination thereof, etc. may be used for the first or second host. The dopant material may also selected by considering a process temperature at which a vapor pressure of the light emitting layer material within the chamber comes to be equal to the process pressure.

At least one of the dopant and host may be changed according to a desired wavelength band of the light emitted by the light emitting layer EML. For example, the dopant and/or host included in the light emitting layer EML emitting light in a blue light wavelength band may be different from the dopant and/or host included in the light emitting layer EML emitting light in a red light wavelength band.

In FIG. 3, only one organic composite layer OL is shown as being between the first electrode EL1 and the second electrode EL2. In some implementations, multiple organic composite layers OL may be provided between the first electrode EL1 and the second electrode EL2. In this case, structures of the organic composite layers OL may differ from one another. For example, the organic composite layers OL may have structures of HTL/EML/ETL, HIL/HTL/ EML/ETL, HIL/HTL/EML/ETL/EIL, HIL/HTL/EBL/ EML/ETL/EIL, HIL/HTL/EML/HBL/ETL/EIL, HIL/HTL/ EBL/EML/HBL/ETL/EIL, etc., as respective examples.

A connecting layer may be provided between the organic composite layers OL. When a voltage corresponding to a built-in potential is applied on the pixel PXL, charges may be generated in the connecting layer. Carriers may be injected from the connecting layer, where the charges have been generated, into the adjacent organic composite layer OL. When the carriers are injected into the organic composite layer OL, the pixel PXL may function more efficiently. In order to inject carriers efficiently, the connecting layer may be doped with dopants such as an organic material, a metal, a metal compound, or other inorganic compounds. These dopant may include a p-type dopant and/or an n-type dopant. The p-type dopant may be, for example, a HAT-CN, TCNQ, or NDP-9 group. The n-type dopant may be selected from an alkaline metal such as Li, Na, K, Rb, Cs and Fr, an alkaline earth metal such as Be, Mg, Ca, Sr, Ba and Ra; and a lanthanide group metal such as lanthanum (La), cerium (Ce), praseodymium (Pr), neodymium (Nd), promethium (Pm), samarium (Sm), europium (Eu), gadolinium (Gd), terbium (Tb), dysprosium (Dy), holmium (Ho), erbium (Er), thulium (Tm), ytterbium (Yb) and lutetium (Lu), as examples. The p-type dopant and the n-type dopant may form the p-type dopant layer and the n-type dopant layer, respectively, and the connecting layer may be formed in multiple layers made of the p-type dopant layer and the n-type dopant layer.

FIGS. 4A-4E illustrate cross-sectional views of a manufacturing process of the pixel according to an embodiment.

According to an embodiment, there is provided a method of forming a thin film including preparing a mixture for depositing a thin film inside a chamber, wherein the mixture for depositing a thin film includes a light emitting layer material for forming a light emitting layer and an additional material for forming at least one layer adjacent to the light emitting layer; and sequentially laminating the light emitting layer and the at least one layer adjacent to the light emitting layer on a substrate by heating the mixture for depositing a thin film up to a process temperature at which a vapor pressures of the mixture for depositing a thin film within the chamber comes to be the same as a process pressure. The light emitting layer material and the additional material may have process temperatures that are different from each other. The light emitting layer material and the additional material may be laminated onto the substrate sequentially according to the process temperatures from materials having lower process temperatures to materials having higher process temperatures.

According to embodiments, by using a mixture for depositing a thin film that is formed by mixing the light emitting layer material and the additional material, it is possible to form a thin film using one chamber. The thin film may be at least one of various layers of an organic light emitting diode (OLED), for example, a light emitting layer EML, a hole injection layer HIL, a hole transport layer HTL, an electron transport layer ETL, and an electron injection layer EIL. In a general method, when the organic composite layer of an OLED includes multiple sub layers, multiple chambers may be required to form the sub layers. For example, when an organic composite layer includes a light emitting layer EML, a hole injection layer HIL, a hole transport layer HTL, a electron transport layer ETL, and a electron injection layer EIL, five chambers may be necessary to form the organic composite layer. As the number of chambers increases, the process time required for forming the organic composite layer may also increase, and a volume of equipment used may also increase, thereby greatly increasing a process cost. On the other hand, according to the present embodiments, even when the organic composite layer includes a plurality of sub layers, it is possible to form the organic composite layer in one chamber.

Mixtures with different process temperatures may be mixed in the mixture for depositing a thin film according to embodiments. These compounds may be materials for forming respective sub layers of the organic composite layer. For example, the light emitting layer material and the additional material may be mixed in the mixture for depositing a thin film. In the meantime, the additional material may include at least one selected from the hole injection layer material, the hole transport layer material, the electronic transport layer material, and the electronic injection layer material. Also, at least one of the electron blocking layer material and the hole blocking layer material may be included in the additional material. As mentioned above, the respective materials may have different process temperatures.

The term "process temperature" refers to a temperature at which a vapor pressure within the chamber comes to be equal to the process pressure. The vapor pressure of the material increases as temperature of the material increases, and the process temperature is the temperature of the material at a point where the vapor pressure of the material comes to be equal to a preset process pressure in a group representing a relation between the temperature of the material and the vapor pressure. As mentioned above, the process temperature should be considered while selecting the light emitting layer material and the additional material. For example, the light emitting layer material and the additional material should be selected such that the order of lamination of the light emitting layer and a layer adjacent to the light emitting layer on the substrate matches the order of the process temperatures of the materials. For example, when a first hole injection layer HILa, a first hole transport layer HTLa, a first light emitting layer EMLa, a first electron transport layer ETLa, and a first electron injection layer EILa are sequentially laminated on a $(1a)^{th}$ electrode EL1a of the substrate SUB as shown in FIG. 4C, the first hole injection layer material has the lowest process temperature, and the process temperature sequentially increases from the first hole injection layer such that the first electron injection layer material has the highest process temperature. Accordingly, even when various kinds of mixtures are mixed in the mixture for depositing a thin film according to embodiments, thin films may be formed sequentially by a heating process performed in a single chamber. For example, the light emitting layer material and the additional material may be laminated sequentially on the substrate from the material with the lowest process temperature according to the process temperatures of the materials.

The layer materials may have different process temperatures. The layer materials may have process temperature differences may prevent codeposition of the materials. Herein, when it is said that no codeposition occurs, it does not necessarily mean the case where only one kind of material is deposited while the other materials are not deposited at all. Rather, the description that no codeposition occurs may refer to the state where one material is primarily deposited at a set temperature. Also, it does not necessarily mean that the codeposition does not occur for all materials. According to an embodiment, the hole injection layer material and the hole transport layer material may have process temperatures enabling codeposition while manufacturing an organic light emitting device. In this case, although the process temperature of the hole injection layer material is lower than the process temperature of the hole transport layer material, the difference may not be big, which may enable the hole transport layer to be formed together during a hole injection layer forming process. When the hole transport layer and the hole injection layer are formed together, the hole injection layer may stabilize the hole transport layer. Therefore, it may be possible to prevent a spotting phenomenon within an output screen due to degradation of the hole transport layer when the organic light emitting device is exposed to a high temperature.

According to an embodiment, when the electron transport layer material, the light emitting layer material, and the hole transport layer material are included in the mixture for depositing a thin film, the electron transport layer material may have a first process temperature, the light emitting layer material may have a second process temperature, and the hole transport layer material may have a third process temperature. The first process temperature and the second process temperature may have temperature differences about 20-100° C., and the second process temperature and the third process temperature may have temperature differences about 20-100° C. If the difference in process temperatures is smaller than about 20° C., the odds of codeposition of the materials in respective layers may increase. When an unintentional codeposition occurs between materials in the respective layers, performance of the respective organic composite layer sub layers may be degraded. This may result in a performance degradation of the overall organic light emitting device. If the difference in process temperatures is greater than about 100° C., no codeposition will occur; however, an overall temperature of an organic composite layer forming process may be greatly increased. An organic compound in the organic composite layer may be deformed at a high temperature. Accordingly, the temperature rise in the overall processes could cause deformation of the organic compound in the organic composite layer and thus the performance degradation of the organic light emitting device. Also, when the overall temperatures of the processes increases, more heat sources may be required for the processes, which could result in a rise in the process cost.

The light emitting layer material may include the host material and the dopant material. The process temperatures of these host and dopant materials may differ from each other by not more than about 10° C. The host material and dopant material may be arranged such that the host material and the dopant material are formed on the same layer at the same time in the light emitting layer forming process. Therefore, it is desirable that the difference in process temperatures of the host material and the dopant material be small. When the host material and the dopant material have a difference not higher than about 10° C. in their process temperatures, the light emitting layer forming process may be performed in a relatively narrow temperature range. Also, by satisfying a proper temperature difference range, it may be possible to prevent the host material and the dopant material from being formed as discrete layers in the light emitting layer.

The process pressure of the thin film forming process may be about $10^{-4}$-$10^{-9}$ Torr. The process pressure range may be optimized to form the organic composite layer efficiently.

By using the light emitting layer material and the additional material having different process temperatures, a deposition process may be used to form the light emitting layer and the layer adjacent to the light emitting layer. The mixture for depositing a thin film including the light emitting layer material and the additional material may be heated such that the temperature of the mixture increases in a stepwise manner. For example, when the electron transport layer material having a first process temperature, the light emitting layer material having a second process temperature, and the hole transport layer material having a third process temperature are included in the mixture for depositing a thin film, the mixture for depositing a thin film may be heated up to the first process temperature at first. Then, the temperature of the mixture for depositing a thin film may be maintained at the first process temperature for a predetermined period of time. When it is determined that all of the electron transport layer material has been vaporized, the mixture for depositing a thin film may be heated up to the second process temperature. When it is determined that all of the light emitting layer material has been vaporized, the mixture for depositing a thin film may be heated up to the third process temperature. By using this stepwise heating process, the light emitting layer material and/or the additional material may form the organic composite layer without being codeposited.

The display device according to an embodiment may include a plurality of pixels. The pixels may emit light in different wavelength bands. In this case, the organic composite layers included in the pixels may be made of different materials. For example, at least one selected from the light emitting layer material and the additional material may vary according to the wavelength band of the light emitted from the light emitting layer.

FIGS. 4A-4E illustrate embodiments in which a first pixel PXLa, a second pixel PXLb, and a third pixel PXLc are formed on a substrate SUB. The mixture for depositing a thin film may include a first mixture for forming a first organic composite layer that emits light in a first wavelength band, a second mixture for forming a second organic composite layer that emits light in a second wavelength band, and a third mixture for forming a third organic composite layer that emits light in a third wavelength band. The first mixture, the second mixture, and the third mixture may be sequentially formed in different areas on a surface of the organic composite layer. At least one of the light emitting layer material and the additional material included in the first mixture, the second mixture, and the third mixture may vary depending on the wavelength band of the light emitted from the light emitting layer.

Figure 4A:
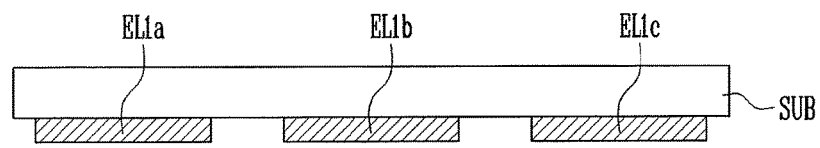
FIGS. 4A-4E illustrate cross-sectional view of stages of a manufacturing process of the pixel according to one embodiment.
Figure 4B:
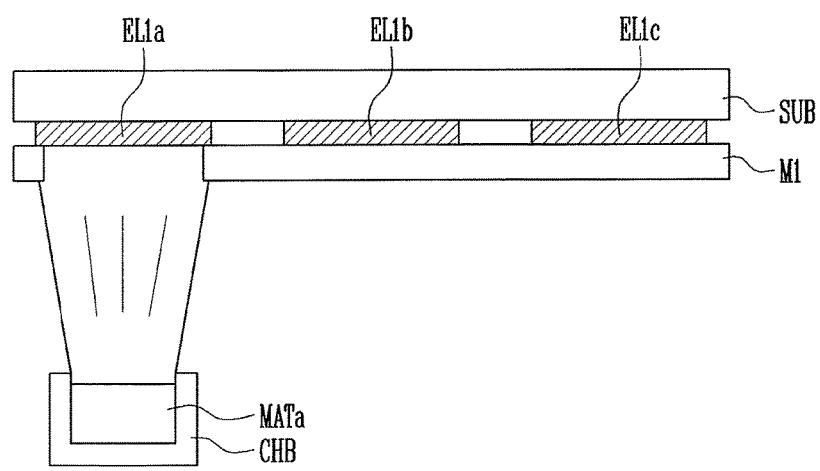
Figure 4C:
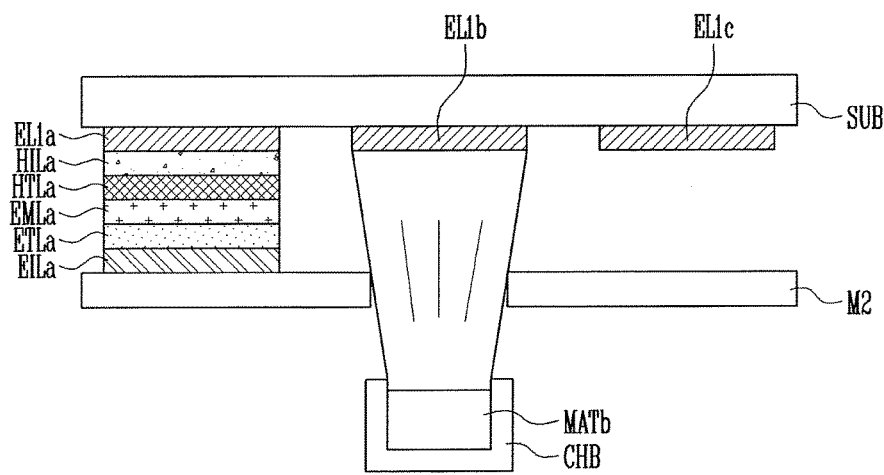
Figure 4D:
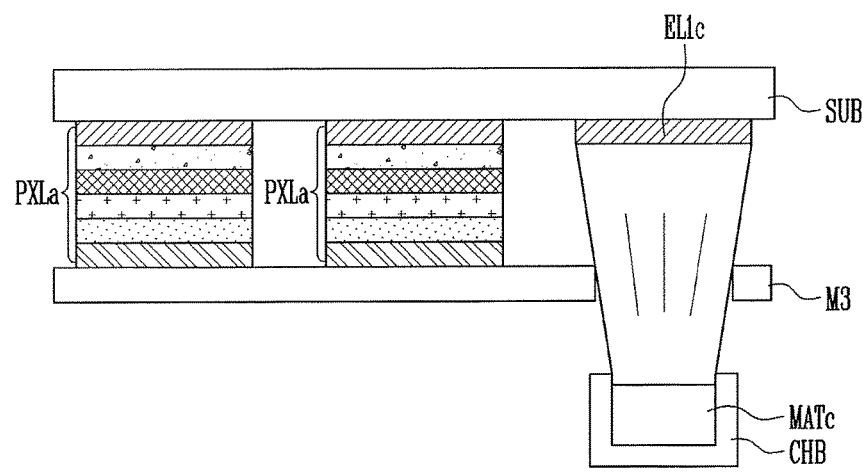
Figure 4E:
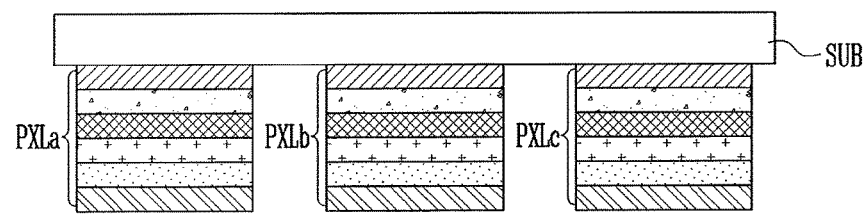

With reference to FIG. 4A and FIG. 4B, a first mask M1 may be attached to a $(1a)^{th}$ electrode EL1a. Then, a first mixture MATa for depositing a thin film may be inserted into a crucible CHB of a chamber. The first mixture MATa may be heated to form the first organic composite layer on the $1a^{th}$ electrode EL1a. The first mask M1 may be removed and a second mask M2 may be attached. After the second mask M2 is attached, the second mixture MATb for depositing a thin film may be inserted into the crucible CHB, and the second mixture MATb may be heated to form a second organic composite layer on a $(1b)^{th}$ electrode EL1b. The second mask M2 may be removed and a third mask M3 may be attached. After the third mask M3 is attached, the third mixture MATc for depositing a thin film may be inserted into the crucible CHB. The third mixture MATc may be heated to form a third organic composite layer on a $(1c)^{th}$ electrode EL1c. Three different pixels may be formed in this manner, thereby avoiding a need for a forming process for every sub layer of the organic composite layer, and avoiding a need for many masks to form a single pixel. According to embodiments, one pixel may be formed by using a single mask. Three pixels may be formed by using one chamber and three masks. This reduction in the number of chambers and masks may result in a reduction in the process cost. Also, the number of crucibles in the chamber may be one or more. When there are many crucibles, each of the crucibles may be provided on positions where the organic composite layer is to be formed. When there is only one crucible, the crucible may be moved to a position where the organic composite layer is to be funned.

The mixture for depositing a thin film according to an embodiment may further include a heat conductor for delivering heat to the light emitting layer material and the additional material. The material used as the heat conductor may have low reactivity and high heat conductivity. For example, metals such as Ag, Au, Pt, etc., may be used as the heat conductor.

The mixture for depositing a thin film according to an embodiment may also include a binder that links the light emitting layer material with the additional material. The binder may link the light emitting layer material with the additional material such that the mixture for depositing a thin film may exist in a specific shape. The mixture for depositing a thin film may have a tabular, pellet, or granular shape. The binder may be included to maintain the desired shape. The binder may be a material having a high process temperature such that the binder is not vaporized during a heating process of the mixture for depositing a thin film. Also, the binder may be a material that establishes links between the light emitting layer material and the additional material with a small bonding energy such that the links may be broken easily by heat. When the mixture for depositing a thin film according to an embodiment has a tabular, pellet, or granular shape, the mixture may be easily transferred and may be inserted into the chamber easily.

By way of summation and review, embodiments provide a method of forming a thin film at an increased process efficiency.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope thereof as set forth in the following claims.

What is claimed is:

1. A method of forming a thin film, the method comprising:
preparing a mixture for depositing a thin film, the mixture for depositing a thin film including a light emitting layer material that forms a light emitting layer and an additional material that forms at least one layer adjacent to the light emitting layer, the additional material including at least one of a hole injection material, a hole transport material, an electron transport material and an electron injection material; and
sequentially laminating the light emitting layer and the at least one layer adjacent to the light emitting layer onto a substrate inside a chamber by heating the mixture for depositing a thin film up to a process temperature of the light emitting layer material and to a process temperature of the additional material,
wherein:
the light emitting layer material and the additional material have process temperatures that are different from each other, and
the light emitting layer material and the additional material are laminated from the mixture onto the substrate sequentially from one of the light emitting layer material and the additional material in the mixture having a lower process temperature to one of the light emitting layer material and the additional material in the mixture having a higher process temperature.

2. The method of forming a thin film as claimed in claim 1, wherein a temperature of the mixture for depositing a thin film is increased in a stepwise manner.

3. The method of forming a thin film as claimed as claimed in claim 1, wherein:
the additional material includes the hole injection layer material and the hole transport layer material, and
the hole injection layer material and the hole transport layer material are codeposited.

4. The method of forming a thin film as claimed in claim 1, wherein:
preparing the mixture for depositing a thin film includes preparing a first mixture for forming a first organic composite layer that emits light in a first wavelength band, preparing a second mixture for forming a second organic composite layer that emits light in a second wavelength band, and preparing a third mixture for forming a third organic composite layer that emits light in a third wavelength band, and
the method of forming a thin film includes forming the each first organic composite layer, second organic composite layer, and third organic composite layer in different areas of the substrate using the first mixture, second mixture, and third mixture respectively.

5. The method of forming a thin film as claimed in claim 4, wherein the method includes heating the first mixture, the second mixture, and the third mixture in a single chamber.

6. The method of forming a thin film as claimed in claim 4, further comprising:
attaching a first mask onto the substrate;
forming a first organic composite layer on the substrate by heating the first mixture;
removing the first mask and attaching a second mask onto the substrate;
forming a second organic composite layer on the substrate by heating the second mixture;
removing the second mask and attaching a third mask onto the substrate; and
forming a third organic composite layer on the substrate by heating the third mixture.

7. A method of forming a thin film, the method comprising:
preparing a mixture for depositing a thin film, the mixture for depositing a thin film including a light emitting layer material that forms a light emitting layer and an additional material that forms at least one layer adjacent to the light emitting layer, the additional material including at least one of a hole injection material, a hole transport material, an electron transport material and an electron injection material, wherein, the mixture for depositing a thin film is formed in or deposited into a crucible; and
sequentially laminating the light emitting layer and the at least one layer adjacent to the light emitting layer onto a substrate inside a chamber by heating crucible containing the mixture for depositing a thin film up to a process temperature of the light emitting layer material and to a process temperature of the additional material,
wherein:
the light emitting layer material and the additional material have process temperatures that are different from each other, and
the light emitting layer material and the additional material in the mixture are laminated from the crucible onto the substrate sequentially from one of the light emitting layer material and the additional material having a lower process temperature to one of the light emitting layer material and the additional material having a higher process temperature.

* * * * *